United States Patent
Arndt

(10) Patent No.: US 12,294,261 B2
(45) Date of Patent: May 6, 2025

(54) STRIP CONDUCTOR DEVICE AND CABLE WHICH CONTAINS THE STRIP CONDUCTOR DEVICE

(71) Applicant: Karlsruher Institut fuer Technologie, Karlsruhe (DE)

(72) Inventor: Tabea Arndt, Eggenstein-Leopoldshafen (DE)

(73) Assignee: KARLSRUHER INSTITUT FUER TECHNOLOGIE, Karlsruhe (DE)

( * ) Notice: Subject to any disclaimer, the term of this patent is extended or adjusted under 35 U.S.C. 154(b) by 254 days.

(21) Appl. No.: 18/250,223

(22) PCT Filed: Oct. 19, 2021

(86) PCT No.: PCT/EP2021/078897
§ 371 (c)(1),
(2) Date: Apr. 24, 2023

(87) PCT Pub. No.: WO2022/089992
PCT Pub. Date: May 5, 2022

(65) Prior Publication Data
US 2023/0396109 A1 Dec. 7, 2023

(30) Foreign Application Priority Data
Oct. 29, 2020 (DE) ...................... 10 2020 128 417.9

(51) Int. Cl.
*H02K 3/02* (2006.01)
*H02K 55/00* (2006.01)
(Continued)

(52) U.S. Cl.
CPC ............. *H02K 3/02* (2013.01); *H10N 60/203* (2023.02); *H10N 60/82* (2023.02); *H02K 55/00* (2013.01)

(58) Field of Classification Search
CPC .......... H02K 3/02; H10N 60/82; H10N 60/83; H10N 60/203; H05K 55/00; Y02E 40/60
(Continued)

(56) References Cited

U.S. PATENT DOCUMENTS

| 1,144,252 A | 6/1915 | Roebel |
| 6,725,071 B2 | 4/2004 | Albrecht et al. |

(Continued)

FOREIGN PATENT DOCUMENTS

| DE | 277012 C | 7/1914 |
| JP | 2019/149344 A | 9/2019 |

(Continued)

OTHER PUBLICATIONS

Barnes, Paul N. et al.; "Low AC Loss Structures in YBCO Coated Conductors with Filamentary Current Sharing"; *IEEE Transactions on Applied Superconductivity*; Jun. 1, 2005; pp. 2827-2830; vol. 15, No. 2; XP011134270; IEEE; Piscataway, NJ, USA.

*Primary Examiner* — Timothy J Thompson
*Assistant Examiner* — Michael F McAllister
(74) *Attorney, Agent, or Firm* — LEYDIG, VOIT & MAYER, LTD.

(57) ABSTRACT

A strip conductor device includes first and second elongated strip conductor elements, each configured to be coupled at a coupling-in end to a contact device for coupling-in electric current and at a coupling-out end to a contact device for coupling-out electric current. The first elongated strip conductor element is a first strip conductor that has a substrate layer that carries a conductor layer that has barrier elements along a length of the conductor layer. The second elongated strip conductor element is a second strip conductor that has a substrate layer that carries a conductor layer that has barrier elements along a length of the conductor layer. The first strip conductor element forms a layer arrangement with (Continued)

the second strip conductor element and the coupling-in ends and the coupling-out ends of the first and second strip conductor elements lie one above the other.

10 Claims, 1 Drawing Sheet

(51) Int. Cl.
*H10N 60/20* (2023.01)
*H10N 60/82* (2023.01)

(58) Field of Classification Search
USPC ..................................................... 174/125.1
See application file for complete search history.

(56) References Cited

U.S. PATENT DOCUMENTS

| 9,024,192 B2 | 5/2015 | Neumüller et al. |
| 2019/0103543 A1 | 4/2019 | Arndt et al. |

FOREIGN PATENT DOCUMENTS

| WO | WO 01/59909 A1 | 8/2001 |
| WO | WO 2005/024963 A1 | 3/2005 |
| WO | WO 2005/096322 A1 | 10/2005 |
| WO | WO 2011/023670 A1 | 3/2011 |
| WO | WO 2015/028343 A1 | 3/2015 |
| WO | WO 2017/162714 A1 | 9/2017 |

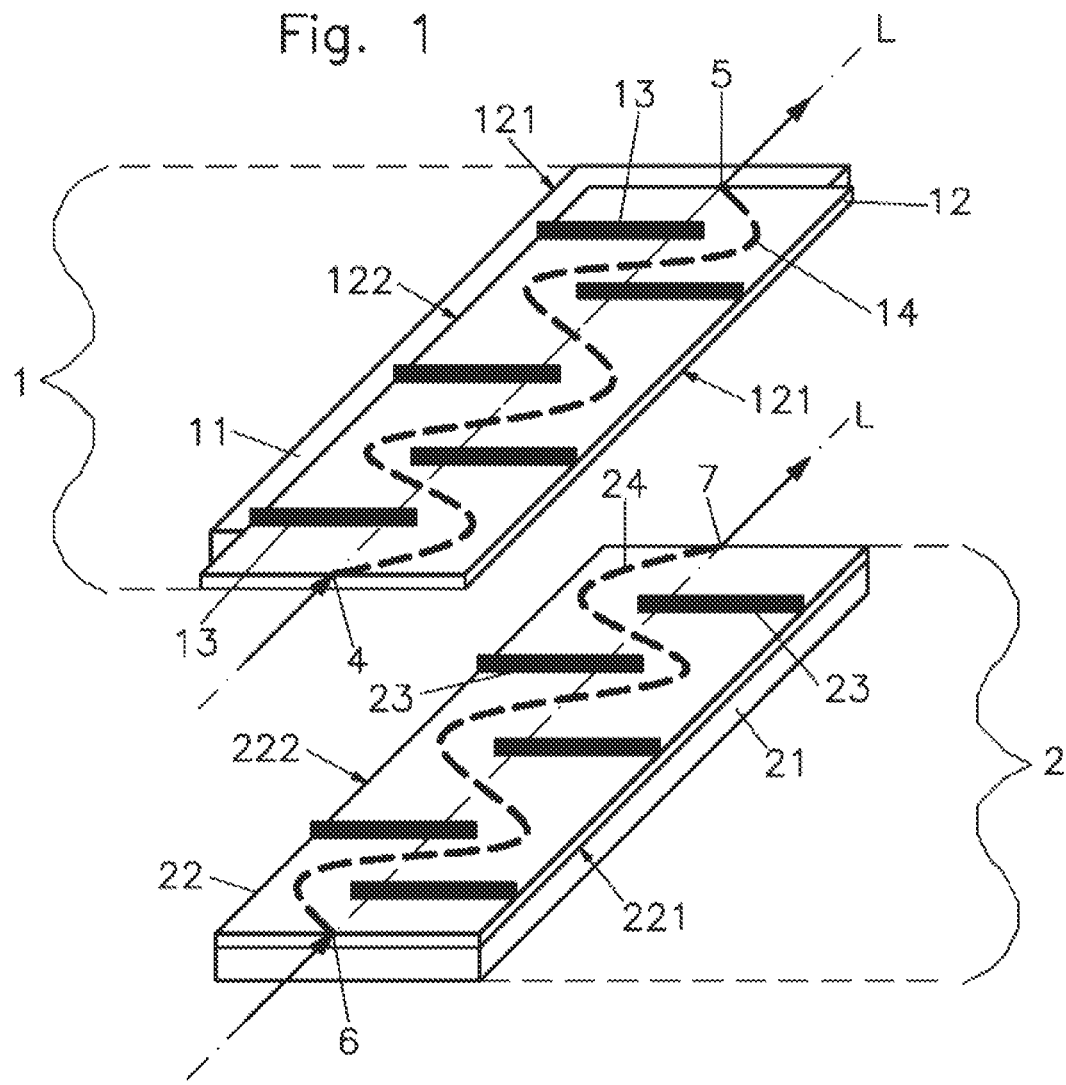
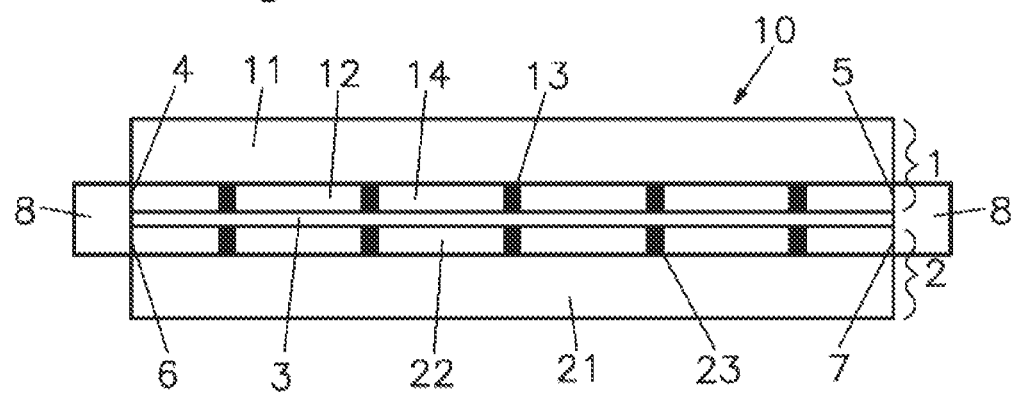

STRIP CONDUCTOR DEVICE AND CABLE WHICH CONTAINS THE STRIP CONDUCTOR DEVICE

CROSS REFERENCE TO RELATED APPLICATIONS

This application is a U.S. National Phase application under 35 U.S.C. § 371 of International Application No. PCT/EP2021/078897, filed on Oct. 19, 2021, and claims benefit to German Patent Application No. DE 10 2020 128 417.9, filed on Oct. 29, 2020. The International Application was published in German on May 5, 2022 as WO/2022/089992 A1 under PCT Article 21(2).

FIELD

The disclosure relates to a strip conductor device and a cable with such a strip conductor device, which is designed to be used in AC-fed devices.

BACKGROUND

Highly efficient energy conductors for use in the alternating current range (AC) are known from the prior art. So-called Roebel conductors and Rutherford cables are used to improve efficiency and to increase the performance of large electrical machines. In particular in the case of high-temperature superconductors (HTS), these conductors are electrical strip conductors, in some cases with superconducting materials, which must be produced in a layered structure and which consisting of individual strands are woven together in a meandering shape, as disclosed in EP 1 733 402 A1, in which three conductor strands are woven together to form a braid. Such strip conductors are mechanically weakened by excessive stress in those sections in which the strip conductors partially overlap or go beyond a meander structure. The individual conductors are difficult to insulate or are insulated with thick insulation layers or a large interspacing and for this reason the cables have a low total current density.

Furthermore, these cables require a plastic deformation of the materials used or a punching-out of the strip conductors to produce the meander structure. From JP 2019-149-344 A, wire is manufactured from high-temperature superconductors, which has strip conductor structure, wherein the strip conductors are punched out in the shape of a meander and are applied to a carrier layer. This type of production is expensive and requires a high outlay on materials; furthermore the risk of degradation results from the treatment of the materials.

To be sure, there are approaches for the production of so-called twist-length strip conductors (for example made of high-temperature superconductors) which enable a twisted guidance of the current within the strip conductor, but which do, however, require a plurality of electrical contacts along the current path. EP 1 668 712 A1 shows a strip conductor made of superconducting material, into which grooves have been scored by micro-etching, in order to penetrate the conductor layer and force the current to follow a curved current path.

Such strip conductors with layer structures very often show high losses when used in the alternating current range. In the case of standard conductors, these are so-called eddy currents flowing over width and length; in the case of superconductors, these are mainly hysteresis and coupling effects, as well as dynamic electrical losses.

SUMMARY

In an embodiment, the present disclosure provides a strip conductor device. The strip conductor device includes first and second elongated strip conductor elements, each configured to be coupled at a coupling-in end to a contact device for coupling-in electric current and at a coupling-out end to a contact device for coupling-out electric current and to thereby providing a current path between the coupling-in end and the coupling-out end. The first elongated strip conductor element is a first strip conductor that has a substrate layer that carries a conductor layer that has barrier elements along a length of the conductor layer. Each barrier element extends from one of two edges of the conductor layer in a direction of a center line, and the barrier elements are arranged alternately with respect to the two edges. The second elongated strip conductor element is a second strip conductor that has a substrate layer that carries a conductor layer that has barrier elements along a length of the conductor layer. Each barrier element extends from one of two edges of the conductor layer in a direction of a center line, and the barrier elements are arranged alternately and mirror-inverted in relation to an arrangement of the barrier elements of the first strip conductor with respect to the two edges. The first strip conductor element forms a layer arrangement with the second strip conductor element and the coupling-in ends and the coupling-out ends of the first and second strip conductor elements lie one above the other.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following:

FIG. 1 a perspective view of the strip conductor device according to the invention in a partial exploded view; and FIG. 2 a sectional view through the strip conductor device along a center line L.

DETAILED DESCRIPTION

In an embodiment, the present invention provides an improved strip conductor with which the aforementioned losses are reduced and which is inexpensive to manufacture.

In an embodiment, the present invention provides a cable which has low electrical losses and is particularly suitable for use in AC-fed devices.

Developments and preferred embodiments of the strip conductor device are set out in the dependent claims.

A first embodiment of the strip conductor device according to the invention comprises two or more elongated strip conductor elements. Each strip conductor element can be coupled at one end to a contact device for coupling-in electric current and at the other end to a contact device for coupling-out electric current. A current path is formed between the coupling-in end for current and the corresponding coupling-out end.

According to the invention, a first one of the two or more strip conductor elements is a first strip conductor which has a substrate layer, which carries a conductor layer which has barrier elements along a length of the conductor layer. Each barrier element here extends from one of the two edges of the conductor layer in the direction of a center line L of the conductor layer. In relation to the two edges, the barrier elements are arranged alternately.

Furthermore, a second of the two or more strip conductor elements is a second strip conductor, which likewise has a substrate layer which carries a conductor layer. This has barrier elements along a length of the conductor layer, wherein each barrier element extends from one of the two edges of the conductor layer in the direction of a center line L of the conductor layer. The barrier elements are arranged alternately in relation to the two edges. With regard to the arrangement of the barrier elements of the first strip conductor, the barrier elements of the second strip conductor are arranged In a mirror-inverted manner. Herein, "mirror-inverted" means that the arrangement of the barrier elements of the two strip conductors has different chirality with respect to one another and are not congruent.

In the strip conductor device, a first strip conductor forms a layer arrangement with a second strip conductor, wherein the respective coupling-in ends of all the first and second strip conductors come to lie one above the other, and likewise the respective coupling-out ends of all the first and second strip conductors come to lie one above the other.

The strip conductor device according to the invention can be designed for use in AC-fed devices. As a result of the specific arrangement of the conductor layers and of the barrier elements in relation to one another, it enables a twisting of the current path, so that electrical fields induced by a temporally variable magnetic field neutralize each other and losses are thus reduced.

In particular, the invention has the advantage that losses when alternating current is used are reduced while the mechanical properties or robustness of the strip conductors are at the same time maintained and high total current densities can be achieved. It is not necessary to deform or punch the strip conductors, but only to introduce the simply held barrier elements into a continuously applied conductor layer, as a result of which production of the strip conductors is inexpensive. Furthermore, hysteresis losses are reduced by an adapted small effective width of the current path. Effective width means the width of the current path perpendicular to the temporally variable magnetic field. This width determines the level of hysteresis losses.

Advantageously, the substrate layer and the respective associated conductor layer of a strip conductor are in each case congruent as regards their surface geometry.

In yet another embodiment of the strip conductor device according to the invention, in each case a first strip conductor and a second strip conductor form a pair in the layer arrangement, wherein the conductor layers are arranged facing each other. As a result, the current paths generated in the two conductor layers can achieve the above-mentioned effect, in order to reduce the resulting losses.

The mutually facing conductor layers are preferably separated from one another by an insulating layer, in order to enable the generation of two separate current paths and to prevent additional losses due to coupling or parasitic currents.

Particularly preferably, the insulating layer between the conductor layers has a thickness that is less than that of the substrate layers, but is thicker than that of the conductor layers. The conductor layers, for example with high-temperature superconductors, have a thickness which is in a range from 200 nm to 50 µm, preferably in a range from 200 nm to 10 µm, particularly preferably 3 µm or 5 µm. The substrate layers have thicknesses which lie in a range from 20 µm to 200 µm. The thickness of the insulating layer therefore lies in a range of approximately 10 µm to 150 µm. A thin insulating layer is sufficient to provide electrical insulation and at the same time to prevent the layer arrangement from becoming too thick, so that strip conductor cables produced therefrom can be installed flat in a mounting arrangement.

Furthermore, a further embodiment of the strip conductor device according to the invention provides that the barrier elements are formed by current-conducting boundaries, such as slots, notches, microstructurings or non-conductive regions. In the case of superconducting conductor materials, the barrier elements are non-conducting or normally conducting; for normally conducting layer materials, the barrier elements must be high-impedance, so that the flowing current also assumes the desired serpentine or sinusoidal course. Such barrier elements can be produced, for example, by laser bombardment, mechanical removal, lithographic methods or even by strong weakening of the superconductivity, for example by changing the oxygen stoichiometry in the conductor material used. These structurings of the barrier elements can be effected either directly in the production process (in situ) or subsequently (ex situ). However, the greatest advantage is achieved by a "bar-like" shape. These barrier elements are easy to insert in the production process of the layer arrangement, so that the strip conductor device can be produced inexpensively.

The barrier elements preferably form a right angle with respect to the center line L of the conductor layers, so that a current path, which extends along the respective conductor layer when a current is coupled in, runs serpentine-shaped, in particular sinusoidally, in the conductor layer. The barrier elements are particularly advantageously linear and run perpendicular to the edges of the conductor layer, in order to allow the current path to run in a serpentine shape. Furthermore, the barrier elements can run at a predetermined angle or be triangular in relation to the edges or to the center line L. It is essential that the barrier elements force the current path into the serpentine shape. The barrier elements can have a length which lies in a range between 10% and 90% of the conductor layer width. Lengths of more than 50% of the conductor layer width, particularly preferably lengths of 60% of the conductor layer width, are advantageous for achieving a defined serpentine shape of the current path. The distance between the barrier elements along the current path or the conductor layer should in this case correspond to a critical length $L_c$, which will be defined below.

The current path which is formed in the second strip conductor corresponds in its sinusoidal profile to the current path within the first strip conductor, but is shifted by a period, so that a right-curved portion of a current path of the first strip conductor comes to lie over a left-curved portion of a current path of the second strip conductor (and vice versa). The electric fields thus cancel each other out over two such sections.

In yet another embodiment of the strip conductor device according to the invention, it is provided that a period of the sinusoidal course of the current path falls below a critical length $L_c/2$, wherein the critical length $L_c$ is given by $$L_c = 4\sqrt{\frac{\rho_m j_c d_{fil}}{4\pi f B}}$$

with the normally conducting resistance of the electric stabilizer ρm, the critical current density $j_c$, the effective width $d_{fil}$, the alternating field frequency f and the magnetic field B. The critical length $L_c$ is thus application-specific, i.e. dependent on the conductor materials used, their thickness and extent along the substrate layer. Exemplary values of the critical length $L_c$ fall within a range from 1 mm to 100 mm. The critical length $L_c$ physically characterizes the length at which the shielding currents in the superconductor of the conductor layer become so large that no reserve is left for a transport current.

The contact device(s) connect(s) the strip conductors at their ends, so that the layer arrangement can be supplied with electrical current by a power source. The current is coupled in and out via these contact devices, which connect all conductor layers of the layer arrangement (at least in pairs). A contact device is preferably provided for the coupling-in of the current and a contact device for the coupling-out. This is the requirement for a cable being producible from the strip conductor device.

According to a further embodiment of the strip conductor device according to the invention, the strip conductors are superconductors, wherein they are preferably selected from the group comprising 2G-HTS RE-123, NbSn or $MgB_2$ (RE=rare earth elements). Superconducting materials are suitable for the conductor layers, since the effect described above can be established by the screening currents when the materials mentioned are in the superconducting state.

The invention further relates to a cable which is designed for use in AC-fed devices and which comprises at least one strip conductor device according to the invention. For embodiment as a cable, the strip conductor device is sheathed by electrically insulating material.

According to a further embodiment of the cable according to the invention, the cable has two or more of the strip conductor devices according to the invention, which form a layered composite.

Other embodiments of the strip conductor device as well as some of the advantages associated with these and other embodiments will be become clear and better understood through the following detailed description with reference to the accompanying figures. The figures are merely a schematic representation of one embodiment of the invention.

In FIGS. 1 and 2, a strip conductor device is shown, which is constructed from a first strip conductor 1 and a second strip conductor 2. The first strip conductor 1 has a substrate layer 11, which carries a conductor layer 12 which has barrier elements 13 along its length in the direction of the longitudinal axis L(center line) in the conductor layer 12. Each barrier element 13 extends from one of the two edges 121, 122, which run along the length of the strip conductor 1 in the direction of a center line L of the conductor layer 12, i.e. along an imaginary line running along the center of the strip conductor, and beyond, so that the length of the barrier elements 13 extends somewhat further than up to this center line L.

In relation to the two edges 121, 122 of the strip conductor 1 arranged alternately with one another in the barrier elements 13, such that, along the longitudinal direction (center line L) of the conductor layer 12, a barrier element 13 extends to and beyond the center line L at right angles and alternately to the left and right, starting from the edges 121, 122. The barrier elements 13 are arranged equidistantly from one another along the conductor layer 12.

The first strip conductor 1 in FIG. 1 and in FIG. 2 is arranged such that in the representation its conductor layer 12 faces downwards and the substrate layer 11 faces upwards.

In the lower part of FIG. 1 and FIG. 2 a second strip conductor 2 is shown, which exhibits the same structure as the strip conductor 1, but is constructed mirror-inverted thereto. Thus, the strip conductor 2 also has a substrate layer 21 on which a conductor layer 22 is applied. Barrier elements 23 are introduced along the conductor layer 22 (along the center line L), wherein each barrier element 23 extends from one of the two edges 221, 222 of the conductor layer 22 in the direction of the center line L. The barrier elements 23 are spaced apart from one another equidistantly and are arranged alternately; in other words, extending again from the left or right starting from the edges 221, 222.

In a strip conductor device, the first strip conductor 1 and the second strip conductor 2 are a pair, so that a layer arrangement 10 is formed. The conductor layers 12, 22 of the two strip conductors 1, 2 face each other and as shown in FIG. 2 are separated from one another by an insulating layer 3 and electrically insulated. In terms of their dimensions, the substrate layers 11, 21 are the thickest layers compared to the other layers, since they are carrier layers. The insulating layer 3 has a thickness that is less than one of the substrate layers 11, 21.

The barrier elements 13, 23 are formed by slits or notches or microstructures and, as shown in FIG. 1, in relation to the center line L of the conductor layers 12, 22 stand at right angles to the edges 121, 122, 221, 222.

The strip conductor 1 has a first end 4 and a second end 5, wherein in FIG. 1 a current path 14 is represented by the arrows and a dashed, curved line. By means of contact devices 8 (see FIG. 2) a coupling-in of the current can be effected at the first end 4 and a coupling-out of the current at the second end 5. Between the two ends 4, 5 of the strip conductor 1, the current path 14 is formed, which has a sinusoidal course due to the barrier elements 13 arranged equidistantly within the conductor layer 12. The period $L_P$ of the sinusoidal current path 14 is selected such that a critical length $L_c$ is undershot.

The strip conductor 2 has a first end 6 and a second end 7, at which current is coupled in and out. In the layer arrangement 10 in FIG. 2 the current is coupled in and out by means of contact devices 8, which electrically connect the conductor layers 12, 22 of the two strip conductors 1, 2 to one another.

Due to the arrangement of the barrier elements 23 in the conductor layer 22 of the second strip conductor 2, which is mirror-inverted in relation to the arrangement of the barrier elements 13 of the first strip conductor 1, a sinusoidal current path 24 is also generated in the second strip conductor 2, which in its course corresponds to the current path 14 within the first strip conductor 1, but is displaced by a period, so that a region of a right-hand curvature of one current path 14 is positioned above the left-hand curvature of the other current path 24. Electric fields that are induced in the two current paths 14, 24 ideally cancel each other out and thereby reduce alternating field losses within the strip conductor device.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE SIGNS

1 First strip conductor
2 Second strip conductor
3 Insulating layer
10 Layer arrangement
11 Substrate layer of first strip conductor
12 Conductor layer of first strip conductor
13 Barrier elements of first strip conductor
14 Current path
21 Substrate layer of second strip conductor
22 Conductor layer of second strip conductor
23 Barrier elements of second strip conductor
24 Current path
121, 122 Edges of first strip conductor
221, 222 Edges of second strip conductor

The invention claimed is:

1. A strip conductor device, comprising:
first and second elongated strip conductor elements, each configured to be coupled at a coupling-in end to a contact device for coupling-in electric current and at a coupling-out end to a contact device for coupling-out electric current thereby providing a current path between the coupling-in end and the coupling-out end,
wherein the first elongated strip conductor element is a first strip conductor that has a substrate layer that carries a conductor layer that has barrier elements along a length of the conductor layer, wherein each barrier element extends from one of two edges of the conductor layer in a direction of a center line, and wherein the barrier elements are arranged alternately with respect to the two edges,
wherein the second elongated strip conductor element is a second strip conductor that has a substrate layer that carries a conductor layer that has barrier elements along a length of the conductor layer, wherein each barrier element extends from one of two edges of the conductor layer in a direction of a center line, and wherein the barrier elements are arranged alternately and mirror-inverted in relation to an arrangement of the barrier elements of the first strip conductor with respect to the two edges,
wherein in the strip conductor device the at least one first strip conductor forms a layer arrangement with the at least one second strip conductor and in each case the coupling-in ends and the coupling-out ends of all the first and second strip conductors come to lie one above the other.

2. The strip conductor device according to claim 1, wherein the substrate layer and the respective associated conductor layer of a strip conductor are in each case congruent.

3. The strip conductor device according to claim 1, wherein in the layer arrangement, in each case a first strip conductor and a second strip conductor form a pair, wherein the conductor layers are arranged facing each other and are preferably separated from one another by an insulating layer.

4. The strip conductor device according to claim 1, wherein the barrier elements are formed by slots or notches or microstructurings and form a right angle with respect to the center line of the conductor layers so that a current path extending in the case of a coupling-in of current from along the respective conductor layer runs sinusoidally lying on the conductor layer.

5. The strip conductor device according to claim 4, wherein a period of the sinusoidal course of the current path falls below a critical length $L_c$, wherein the critical length $L_c$ lies in a range of 1 mm to 100 mm.

6. The strip conductor device according to claim 1, wherein the strip conductors are superconductors.

7. A cable, designed for use in AC-fed devices, which comprises at least one strip conductor device according to claim 1, wherein the strip conductor device is sheathed by electrically insulating material.

8. The cable according to claim 7, wherein two or more of the strip conductor devices form a layered composite.

9. The strip conductor device according to claim 3, wherein the insulating layer has a thickness that is less than that of the substrate layers.

10. The strip conductor device according to claim 6, wherein the superconductors are selected from a group comprising 2G-HTS RE 123, NbSn, and/or $MgB_2$.

* * * * *